United States Patent [19]

Itoh et al.

[11] Patent Number: 4,926,242

[45] Date of Patent: May 15, 1990

[54] ALUMINUM-SILICON ALLOY HEATSINK FOR SEMICONDUCTOR DEVICES

[75] Inventors: Yoshiaki Itoh; Yusuke Odani; Kiyoaki Akechi; Nobuhito Kuroishi, all of Hyogo, Japan

[73] Assignee: Sumitomo Electric Industries, Ltd., Osaka, Japan

[21] Appl. No.: 39,714

[22] Filed: Apr. 20, 1987

Related U.S. Application Data

[62] Division of Ser. No. 783,603, Oct. 3, 1985, abandoned.

[30] Foreign Application Priority Data

Oct. 3, 1984 [JP] Japan .................. 59-208471
Nov. 14, 1984 [JP] Japan .................. 59-240034
Nov. 29, 1984 [JP] Japan .................. 59-253497

[51] Int. Cl.$^5$ .......................... H01L 23/36
[52] U.S. Cl. ........................ 357/81; 357/67;
357/74; 357/80; 420/548; 420/528; 165/905;
174/16.3
[58] Field of Search ............ 357/81, 67, 74, 80;
420/548, 528; 174/16 HS; 165/905

[56] References Cited

U.S. PATENT DOCUMENTS 3,154,444 10/1964 Wieland .................. 420/548
3,290,188 12/1966 Ross et al. .................. 420/548
3,791,820 2/1974 Werner .................. 420/548
4,517,584 5/1985 Matsushita .................. 357/81
4,663,649 5/1987 Suzuki et al. .................. 357/81
4,703,339 10/1987 Matsuo .................. 357/81

FOREIGN PATENT DOCUMENTS 0072705 6/1979 Japan .................. 420/548
0035649 2/1984 Japan .................. 420/548
0100250 6/1984 Japan .................. 420/548
1104043 5/1986 Japan .................. 420/548
0183016 6/1986 Japan .................. 420/548

*Primary Examiner*—Andrew J. James
*Assistant Examiner*—Jerome Jackson, Jr.
*Attorney, Agent, or Firm*—Cushman, Darby & Cushman

[57] ABSTRACT

A new material for use in the manufacture of semiconductor devices, a method of manufacturing the new material, and a heat radiator structure for a semiconductor device. The material is an aluminum alloy containing 30–60% by weight of Si and the remaining weight % is Al. The method of manufacture includes solidifying molten material into a powder and forming the powder by hot plastic working. The heat radiator structure includes a substrate of envelope material and an Al-Si alloy layer glued to the substrate through a function layer.

12 Claims, 3 Drawing Sheets

ALUMINUM-SILICON ALLOY HEATSINK FOR SEMICONDUCTOR DEVICES

This is a division of application Ser. No. 783,603, filed Oct. 3, 1985 now abandoned.

BACKGROUND OF THE INVENTION

This invention relates to semiconductor materials for use in various integrated circuit, methods of semiconductor material manufacture, and heat radiation structure for a semiconductor devices.

Semiconductor elements such as transistors and diodes are generally affected by temperature or extremely sensitive to heat. If the temperature of the environment of such an element rises, it causes the resistivity of the element to reduce, the reverse-current to increase, the output resistance to decrease and accordingly the current amplification factors to reduce. As a result, the element will ultimately cease to function.

When power is supplied to a transistor to operate it, power equivalent to the difference between its input and output is consumed as a collector loss within the semiconductor element itself. Heat is generated by this loss. That heat will also bring about the same problems as aforementioned. This has been the reason why power transistors, in particular, are provided with a cooling body or radiator (heat sink).

Moreover, with the latest progress in semiconductor technology and large scale integration of elements, there is a growing tendency toward increasing the size of the element itself and mounting a plurality of semiconductor chips on one package to provide a multi-chip package. Consequently, it has become inevitable that the size of the IC package carrying those semiconductor chips increases. It has become important to match the thermal expansion coefficients of materials constituting the package and thermal design relative to the semiconductor elements.

For instance, the thermal expansion coefficient of materials constituting a semiconductor substrate must be at least different from that of the semiconductor element so that distortion due to thermal stress can be prevented. Accordingly, there have been used, as a material having a small thermal expansion coefficient, an Ni alloy such as cobale (29% by weight of Fe-Ni 17% by weight of Co-Fe) or 42 alloy (42% by weight of Ni-Fe), or ceramics such as alumina or fosterite.

Recent progress in semiconductor technology has led to the introduction of large-sized elements and increased integration. These have presented problems of heat radiation as well as the difference between thermal expansion coefficients. When the size and integration of elements are increased, materials in use need to provide not only a smaller difference between thermal expansion coefficients but also greater heat radiation.

There have been proposed, as materials satisfying both characteristic requirements, beryllia-ceramics, tungsten and molybdenum.

However, since beryllia-ceramics are highly poisonous, they are practically unusable in view of safety and environmental problems.

Also, since molybdenum and tungsten are rare metals and locally distributed, they are highly expensive. A semiconductor device using such metal materials will be expensive to produce. In addition, since such metals are relatively dense metals (19.3 g/cm$^3$ and 10.2 g/cm$^3$ for W and Mo, respectively), they have disadvantages including heavy weight and the relative difficulty of undergoing mechanical processing.

In view of excellent thermal conductivity, copper or aluminum alloys have been used as a heat sink (heat radiation plate) when thermal design of semiconductor devices is made. However, thoses alloys are normally a bad match, in terms of a thermal expansion coefficient, for ceramics such as $Al_2O_3$ and SiC, metal materials such as Fe-Ni-Co alloy, Fe-Ni alloy, W and Mo, or compound materials prepared from the aforementioned metal and copper when the latter is used as a housing material for semiconductor devices. Because of this mismatching a bend or curvature is produced when they are mated with a substrate during the manufacturing process.

SUMMARY OF THE INVENTION

In view of the foregoing, it is an object of the present invention to provide a material for a semiconductor device and a method for producing the material. The material must be light in weight, excellent in mechanical workability and capable of meeting characteristic requirements in terms of not only heat radiation but also difference in the thermal expansion coefficient.

It is another object of the present invention to provide a heat radiation structure that is excellent in heat conductivity (heat radiation), capable thermal expansion coefficient matching, with the aforementioned material for a semiconductor device, and free from a bend or curvature.

The inventors have studied the possibility of accomplishing the above-described objects and found that a material capable of satisfying the characteristic requirements for a semiconductor device in terms of not only a thermal expansion coefficient but heat radiation can be obtained by adding a large amount of silicon to aluminum. The present invention is based on such finding.

The material for a semiconductor device according to the present invention is an aluminum alloy containing 30–60% by weight of Si and Al as the rest. The material according to the present invention is prepared by solidifying molten material at an average cooling speed of over $10^{2°}$ K. sec through an atomizing method into more than 42-mesh alloy powder and forming by hot plastic working.

In another method of preparation, the material according to the present invention for a semiconductor device is prepared by uniformly dispersing Si powder into an aluminum matrix through a mechanical alloying method and forming the compound material by hot plastic working into an aluminum alloy containing 30–60 by weight of Si and Al as the rest.

The heat radiation structure according to the present invention comprises a substrate as an envelope for semiconductor device and an alloy layer prepared from the aforementioned material and joined onto the substrate through a junction layer, the alloy layer functioning as a heat sink.

BRIEF DESCRIPTION OF THE DRAWING

FIG. 2 illustrates an application of the example to a substrate for a semiconductor device.

FIG. 3 illustrates an application of the example to a heat sink incorporated in the substrate for a semiconductor device.

FIG. 4 illustrates another application of the example to a heat sink.

DETAILED DESCRIPTION OF THE PREFERRED EMBODIMENT

The method of preparing the material according to the present invention for a semiconductor device using the mechanical alloying method will be described first. In this method, Si powder is uniformly dispersed in an aluminum matrix through the mechanical alloying method and the compound material is formed by hot plastic working into the desired material. The "mechanical alloying method" is a new development of the mechanical mixing method in the field of powder metallurgy and designed to compound powder particles by utilizing the energy of a mixing mill. The mechanical alloying method utilizing the energy of the mixing mill is characterized in that alloy series can be selected, irrespective of whether the alloy is solid or not in the state diagram.

Heretofore, the amount of silicon added to Al-Si alloy has been only less than 20% by weight at a practical level, because the initial crystal becomes coarse as the amount increases. However, by the mechanical alloying method wherein no restriction is imposed according to the state diagram, it has become possible to add silicon as much as 30~60% by weight.

Although aluminum has been used as matrix metal according to the present invention, not only Al but also Cu, Ag, etc. is usable, provided that higher heat conductivity is available. However, the reason for the exclusive use of aluminum according to the present invention is that it is lightweight with smaller specific gravity and can be processed so that an insulating film may readily be formed thereon through the anodizing process as described later.

Figure 1:
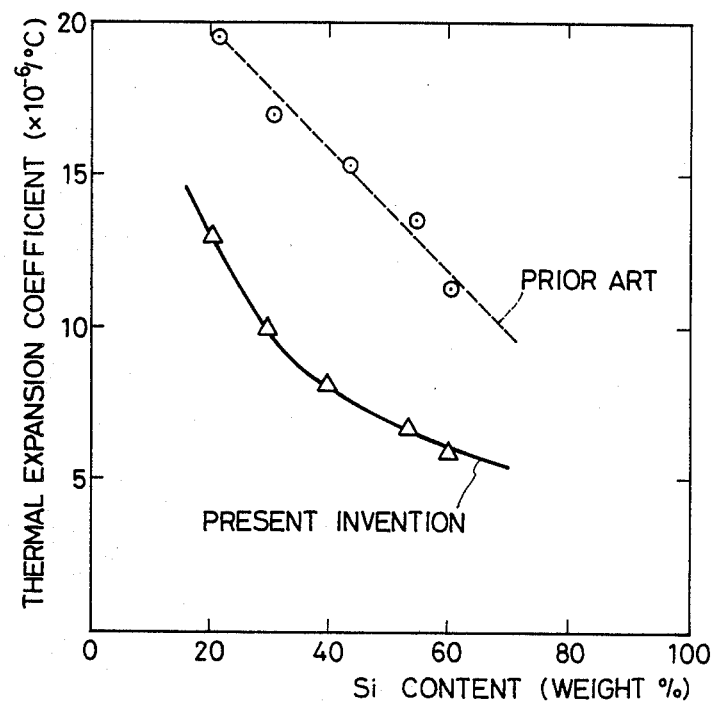
FIG. 1 is a graph illustrating the relation between the quantity of Si contained and the thermal expansion coefficient, wherein a continuous line represents the example of the present invention and a dotted line a conventional example.

Although aluminum is a low density metal, light in weight, superior in heat conductivity and thus fit for use as a semiconductor substrate, it's thermal expansion coefficient is large as $23.5 \times 10^{-5}$. As aforementioned, 30~60% by weight of Si particles is added according to the present invention and consequently the thermal expansion coefficient becomes reducible to a large extent. Fig. 1 indicates the relation between the thermal expansion coefficient and the amount (% by weight) of Si particles added. In FIG. 1, the continuous line represents the process by means of the mechanical alloying method according to the present invention, whereas the dotted line designates the process through the conventional mechanical mixing method. As is clear from FIG. 1, the material obtained through the conventional method is characterized in that the thermal expansion coefficient linearly increases as the amount of Si added decreases, whereas the thermal expansion coefficient of what has been obtained through the method according to the present invention can be prevented to a large extent from increasing.

The reason amount of Si contained is limited to 30~60% by weight is that the thermal expansion coefficient will exceed a desired value when the amount of Si contained is smaller than 30% by weight, whereas heat conductivity and hot workability will be far deteriorated when that amount exceeds 60% by weight. In brief, the influence of the stress caused by the mismatching of thermal expansion coefficients should be minimized by averaging the thermal expansion coefficients of Si and GaAs as a semiconductor element and sintered aluminum as an envelope material within the aforesaid range and the amount of Si should properly be selected depending on the shape and size of a package within that range.

The particle diameter of Si powder in the present invention should preferably be 0.3~50 μm and the reason for this is attributable to a sharp decrease in thermal conductivity if the diameter is smaller than 0.3 μm and, if it exceeds 50 μm, the loss of the effect of suppression of thermal expansion through the mechanical alloying method, simultaneously with the deterioration of hot workability wherein the anodic oxidation layer will be deteriorated when the material is processed to be made into anodizing, that is further deterioration of workability.

In case the material obtained according to the present invention for a semiconductor device is required to be an electrically insulating, corrosion resistant material, it may be usable as one equivalent to ceramics by processing it into alumite or coating its surface with a thin layer made of ceramics or organic insulating material. Some working examples will now be described.

The atomizing method was employed to obtain −100-mesh aluminum powder and the mechanical alloying process was applied to keep the aluminum powder in the atmosphere of Ar for five hours in a dry-type attritor so that the aluminum powder may contain 20, 30, 40, 50 and 60% by weight of −350-mesh Si powder. Copper containers were filled with the powder thus processed and obtained, which was subjected to deaeration under vacuum at 400°~550° C. and vacuum-enclosed before being extruded at the aforementioned temperature.

Each of the samples thus obtained was examined in terms of density, thermal conductivity, thermal expansion coefficient, hardness and workability (machinability). The results obtained are shown in Table 1.

| Composition: (% = % by weight) | Thermal expansion coefficient: ($\times 10^{-6}/°C.$) | Thermal conductivty: (cal/sec °C. cm) | Hardness: (HRB) | Machinability |
|---|---|---|---|---|
| Al-20% Si | 13.1 | 0.39 | 32 | Good |
| Al-30% Si | 10.4 | 0.35 | 49 | Better |
| Al-40% Si | 8.2 | 0.31 | 57 | Better |
| Al-50% Si | 6.5 | 0.24 | 67 | Better |
| Al-60% Si | 5.8 | 0.20 | 76 | Good |
| Al-65% Si | 5.6 | 0.16 | 87 | Bad |

The Si powder was mixed together with the conventional mixing method (using a V-type mixer) for 20~30 minutes and extruded bars were obtained in the same manner as aforementioned. The comparative samples thus obtained were examined in terms of a thermal expansion coefficient. The dotted line in FIG. 1 shows the results obtained.

Subsequently, the method of producing the material for a semiconductor device according to the present invention through the powder metallurgy will be described. In this method, the molten material containing Al and Si was solidified through the atomizing method at an average cooling speed of over $10^{2°}$ K./sec and made into less than 42-mesh alloy powder and then the powder was formed by hot plastic working.

The particle diameter of the initially crystallized Si should be preferably 50 μm and mechanical workability will be further improved, whereas a desired thermal expansion coefficient will become obtainable.

The material for a semiconductor device is not good when the thermal expansion coefficient is $18 \times 10^{-6}$/°C. Preferably, the thermal expansion coefficient is $15 \times 10^{-6}$/°C. or less.

In order to make the initial Si crystal smaller and allow the material to contain a large amount of Si, the molten material must be cooled quickly. According to that manufacturing method, it is possible to obtain a near net shape close to what has been intended as a final product shape from the powder by, for instance, powder forging, extrusion-forming and sinter-forging. Consequently, the manufacturing method is advantageous in that the mechanical working quantity can be reduced. In that case, the metal powder should preferably be 42 meshes or less in size. In case the particle diameter exceeds the value above, a cooling speed of $10^{2°}$ K./sec will not be obtained and accordingly the initially crystallized Si tends to become coarse.

The principal role of Si to be added an alloy element is to reduce the thermal expansion coefficient. The reason for the use of particularly Si as one of the components constituting the alloy is that it is more effective than other elements in reducing the thermal expansion coefficient. Accordingly, it is needless to say acceptable to add one or more than one element other than Si, for instance, Mo, W, Nb, Zr, Cr, Ir, Ti and Fe to the extent that the total quantity of them will not exceed 10% by weight.

The material for a semiconductor device according to the present invention includes those used as a semiconductor substrate and intended for use as a heat sink incorporated with the semiconductor substrate. Accordingly, the present invention is applicable to the material for semiconductor devices in a broad sense.

Figure 2:
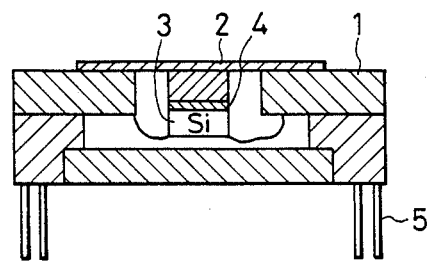
FIGS. 2–4 are cross sectional views of examples of IC packages using materials obtainable for a semiconductor device according to the present invention.
Figure 3:
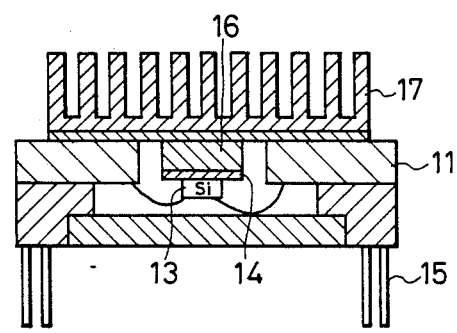
Figure 4:
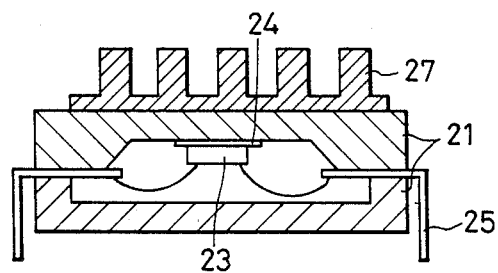

Al-Si alloy thus obtained was used to IC package shown in FIGS. 2 through 4 in transverse cross section. In the IC package shown in FIG. 2, a substrate 2 made of the material obtained according to the embodiment of the present invention is mounted on a housing 1 formed of ceramics such as alumina and a semiconductor element 3 is bonded to the under surface of the substrate 2 for a semiconductor through a solder layer 4. Numeral 5 indicates cobale wires as lead-out terminals.

In the example shown in FIG. 3, the structure is different from what is shown in FIG. 2 and a semiconductor element 13 is bonded to a substrate 16 prepared from copper-tungsten alloy, whereas a heat sink 17 made of the material obtained for a semiconductor device according to the present invention has been incorporated with the substrate 16.

In the structure shown in FIG. 4, a semiconductor element 23 is bonded to an envelope 21 prepared from ceramics such as alumina through a metallized layer 24 and a heat sink 27 prepared from the material for a semiconductor device according to the present invention is bonded onto the surface of the envelope 21. Like reference numbers are given to like parts common to FIGS. 2 and 3.

The material for a semiconductor device according to the present invention is obtained in such structures as shown in FIGS. 2 through 4 and, as is obvious from FIG. 3 or 4, it should be noted that the present invention is applicable to not only a substrate for a semiconductor device in a narrow sense but also a general structural material for a semiconductor device such as a heat sink to which a semiconductor element is coupled.

When the Al-Si alloy according to the embodiment of the present invention was used for each IC package shown in FIGS. 2, 3 or 4, no distortion due to thermal stress during the IC packaging process was generated because the difference in the thermal expansion coefficient between the alloy and $Al_2O_3$ constituting the semiconductor chip and other housing members. At the same time, the structure as a device offering excellent heat radiation capability has proved greater durability and higher reliability.

Examples of the material used for a heat radiation structure according to the present invention for a semiconductor device will subsequently be described in detail.

In the heat radiation structure according to the present invention, the substrate as an envelope for a semiconductor device is one selected from a group of $Al_2O_3$, SiC, BeO, AlN, Fe-Ni alloy, Fe-Ni-Co alloy, Mo and W or compound materials composed of such metal and Cu. Moreover, the substrate may be a laminated ceramic one including multilayer wiring.

The junction layer between the substrate and the heat sink of Al-Si alloy is a resin layer containing BN, Ag when importance is attached to conductivity and another containing $SiO_2$ when its strength is emphasized. Moreover, when Al-Si alloy is processed into anodic oxidation and glued to the envelope, it will be composed of anodic oxidation and adhesive layers. As for the envelope and the heat sink of Al-Si alloy, the surface of the former or latter is coated with a metal layer (for instance, Ni readily wettable with brazing metal (plating method and various evaporation methods being utilizable). For instance, eutectic crystal brazing metal or solder may be used for brazing purposes and, in this case, the junction layer comprises the metal coating layer, eutectic crystal, i.e. Au, brazing metal and solder.

As a radiation fin or heat sink, it is not always limited to a particular shape though its surface area must be as large as possible and any known configuration is utilizable.

Figure 5:
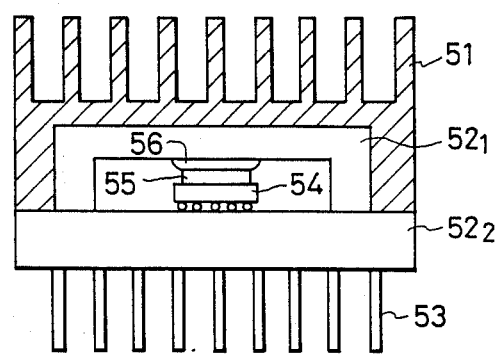
FIG. 5 is a cross sectional view illustrates a type example of an IC package wherein an IC is built in a heat radiation structure for a semiconductor device according to the present invention.
Figure 6:
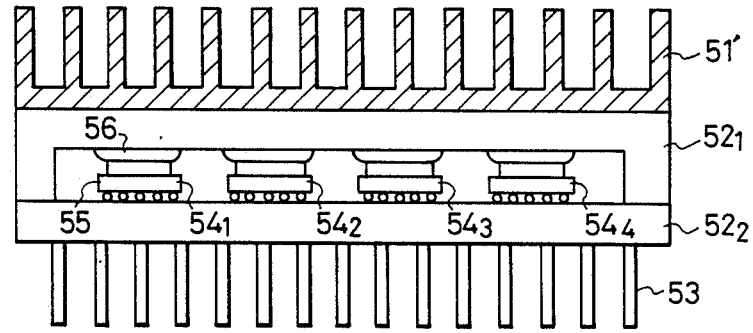
FIG. 6 is a cross sectional view illustrating a type example of an IC package wherein a multi-chip board is built in a heat radiation structure embodying the present invention.

FIGS. 5 and 6 show preferred embodiments of the heat radiation structures according to the present invention. In the example of FIG. 5, a heat sink 51 is joined to an envelope $52_1$ in such a manner as to cover the surface thereof, whereas an envelope $52_2$ is equipped with cobale wires 53, that is, leads on the under surface thereof and used to form a space for containing a semiconductor chip, for instance, a silicon chip 54 in cooperation with the inside recessed portion of the envelope $52_1$. In that space, the silicon chip 54 is attached to the inside face of the envelope $52_1$ through an Mo plate 55 (thermal expansion buffer plate) and a solder layer 56. On the other hand, the chip 54 is electrically bonded to the bonding portions of the leads on the surface of the envelope 52₂ by means of an Au bump or wire bonding. The applicable chip packaging method at that time may be of either face-up or face-down type. In this embodiment, the heat sink 51 is equipped with parallel, relatively high flat plate fins arranged at equal intervals.

In the case of an example of FIG. 6, package construction similar to that of FIG. 5 is provided to contain a plurality of chips $54_1 \sim 54_4$. Like reference characters have been given to like parts of FIG. 5 to make them self-explanatory. Although a heat sink 51' has the same construction as that of the heat sink of FIG. 5 in terms of an arrangement of heat radiation fins in this embodiment, its bottom face has the same dimensions as those of the surface of the envelope 52₁ and both faces are joined together through a junction layer.

The heat radiation structure according to the present invention will be described further in detail, with reference to specific examples, to more clearly explain the advantages of the present invention. However, it is to be understood that the present invention is not limited to the specific embodiments (examples) described.

EXAMPLE 1

There were prepared Al-Si alloy powders, each containing 25, 30, 35, 40, 45, 50, 60 and 65% by weight of Si through the gas atomizing method. Then the powder was sifted to obtain 60-mesh powder and each aluminum container was filled with the powder obtained to degas it under vacuum. The powder was formed by hot extrusion into a plate material 20 mm thick, 40 mm wide and 1,000 mm in length. The plate materials were cut into test samples and subjected to measurement according to the normal test method in terms of the density, thermal expansion coefficient, thermal conductivity and hardness (Rockwell hardness HRB). Table 2 shows the results measured.

TABLE 2

| Physical property/ Test pc. | Density: (g/cm³) | Hardness: (HRB) | Thermal expansion: ($10^{-6}/°C.$) | Thermal conductivity (Cal/sec. °C. cm) |
| --- | --- | --- | --- | --- |
| Al-25Si | 2.60 | 37 | 13.8 | 0.38 |
| Al-30Si | 2.53 | 49 | 12.4 | 0.35 |
| Al-35Si | 2.55 | 53 | 11.5 | 0.32 |
| Al-40Si | 2.53 | 57 | 10.5 | 0.30 |
| Al-45Si | 2.50 | 62 | 9.6 | 0.27 |
| Al-50Si | 2.46 | 67 | 7.2 | 0.24 |
| Al-60Si | 2.42 | 79 | 6.2 | 0.21 |
| Al-65Si | 2.40 | 84 | 5.8 | 0.13 |

The same process was employed to obtain samples containing less than 30% by weight of Si and more than 50% by weight of the same and various physical properties were examined. The thermal expansion coefficient of the sample containing less than 30% by weight of Si exceeded $18 \times 10^{-6}/°C.$, whereas the thermal conductivity of the one containing more than 50% by weight of Si indicated an extremely small thermal expansion coefficient. In other words, those materials in both cases were found unsatisfactory as a heat sink material intended in the present invention.

EXAMPLE 2

The extruded aluminum alloy prepared in the Example 1 containing 40% by weight of Si was processed into $19 \times 19 \times 10$ mm and $54 \times 54 \times 10$ mm radiation fins, which were glued onto alumina substrates with resin paste containing BN to make IC packages incorporating semiconductor chips as shown in FIGS. 5 and 6. The packages for semiconductor devices using aluminum alloy in this example exhibit excellent heat radiation and reliability.

EXAMPLE 3

Figure 7:
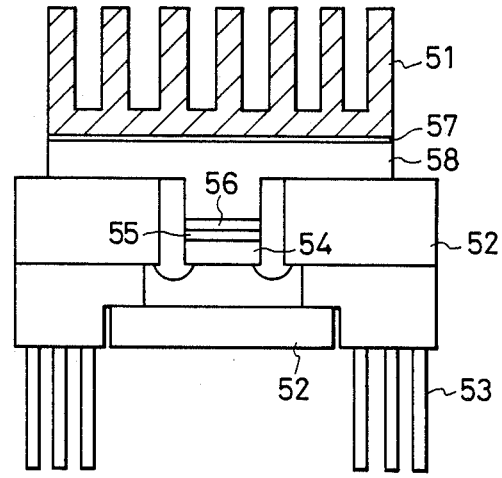
FIG. 7 is a corss sectional view illustration another embodiment of the IC package of FIG. 1 using a heat radiation structure embodying the present invention.

The extruded aluminum alloy prepared in the Example 1 containing 45% by weight of Si was made into a $19 \times 19 \times 10$ mm radiation fin, which was plated with Ni. The Ni plated fin was glued onto a Cu-Mo substrate as an envelope coated with Ni with solder to provide a package for a semiconductor device incorporating a semiconductor chip. FIG. 7 shows a cross sectional view of a type representing the package thus obtained. This package for a semiconductor device proved excellent heat radiation capability and, even when it was exposed to high temperatures at the time of junction by means of solder, no cracking nor distortion was produced in the junction face.

The package structure of the semiconductor device of FIG. 7 comprises, in brief, a heat sink 51 provided on the surface of a Cu-Mo alloy plate 58 through a solder layer 57 (junction layer) and a Si chip mounted on the embossed portion of the inside of the alloy plate 58 by a solder layer 56 through a ceramic insulated plate 55. The remaining parts are given like reference numbers of FIG. 5.

EXAMPLE 4

The extruded aluminum alloy prepared in the Example 1 containing 35% by weight of Si was made into a $19 \times 19 \times 10$ mm radiation fin, which was subjected to the hardening alumite process to provide a film 20 μm thick. The radiation fin thus obtained was glued to an Al₂O₃ envelope with resin containing Ag to obtain a package for a semiconductor device having a built-in semiconductor chip. The package for a semiconductor device demonstrated excellent heat radiation capability and high reliability.

The package for a semiconductor device in this example has roughly the same construction as that of FIG. 3. However, an Al₂O₃ substrate in place of the Cu-Mo substrate of FIG. 7 was used and the junction layer 57 was made of Ag paste.

As set forth above, because the material for a semiconductor device is formed of Al alloy containing 30% by weight of Si an Al as the rest according to the present invention, the difference in the thermal expansion coefficient between that material and a semiconductor element and other envelope materials and consequently distortion due to thermal stress can be reduced. Moreover, the material with excellent heat radiation properties is capable of contribution to prolonging the life of the device and increasing its reliability. As the material is relatively low in density, it can be made compact and, with excellent mechanical workability, by far inexpensive.

For the heat radiation structure according to the present ivention, Al-Si alloy containing 30~60% by weight of Si and Al as the substantial remaining part is used for a heat sink material, which is then glued to a substrate as an envelope for a semiconductor device. Accordingly, the matching of the thermal expansion coefficient of the sink material with that of the envelope material has been far improved, so that a bend or curvature after junction of materials and thus cracking in the joined faces are avoided. This has made it possible to make heat design in line with the recent trend toward increasing chip size and power. As excellent heat conductivity is offered thereby, packages capable of high heat radiation helps prolong the life of devices and improve not only their reliability but also more easily maintained.

Other embodiments and modifications of the present invention will be apparent to those of ordinary skill in the art having the benefit of the teaching presented in the foregoing description and drawings. It is therefore, to be understood that this invention is not to be unduly limited and such modifications are intended to be included within the scope of the appended claims.

What is claimed is:

1. A package comprising:
    a substrate made of a ceramic material;
    at least one heat generating component mounted on a first surface of said substrate; and
    at least one heat sink fixed on a second surface of said substrate opposite said first surface, and made of an aluminum-silicon alloy material, said aluminum-silicon alloy material containing silicon in a weight percentage ranging from 30% through 40%.

2. A heat radiation structure for a semiconductor device, said structure being equipped with a substrate in the form of an envelope for the semiconductor device and an Al-Si alloy layer glued onto said substrate through a junction layer, said Al-Si alloy layer containing 30–60% by weight of Si and functioning as a heat sink.

3. A heat radiation structure according to claim 2, wherein said substrate is comprised of a material selected from a group consisting of Al$_2$O$_3$, SiC, BeO and AlN or Fe-Ni alloy, Fe-Ni-Co alloy, Mo and W, and compound materials composed of the aforementioned metals and Cu.

4. A heat radiation structure according to claim 2, wherein said Al-Si alloy contains at least one element selected from a group of Mo, W, Nb, Zr, Cr. Ir, Ti and Fe, the quantity of said element being 10% by weight or less.

5. A heat radiation structure according to claim 3, wherein said Al-Si alloy contains at least one element selected from a group of Mo, W, Nb, Zr, Cr. Ir, Ti and Fe, the quantity of said element being 10% by weight or less.

6. A heat radiation structure according to claim 2, wherein said substrate is a laminated ceramic one including multilayer wiring.

7. A heat radiation structure according to claim 2, wherein the Al-Si alloy is made with powdered crystallized Si having a particle size 50 microns or less.

8. A heat radiation structure according to claim 2, wherein the Al-Si alloy has a thermal expansion coefficient of $18 \times 10^{-6}/°C$. or less.

9. A heat radiation structure according to claim 2, wherein a part of the Al-Si alloy layer which is disposed on said junction layer is anodically oxidized.

10. A heat radiation structure according to claim 2, wherein said junction layer is a paste layer containing Ag, Bn or SiO$_2$.

11. A heat radiation structure according to claim 2, wherein said junction layer comprises a metal coated layer readily wettable with brazing metal and an Au eutectic crystal or solder layer.

12. A heat radiation structure according to claim 11, wherein said metal coated layer readily wettable with brazing metal is made of Ni.

* * * * *